United States Patent [19]
Scott et al.

[11] Patent Number: 5,848,235
[45] Date of Patent: Dec. 8, 1998

[54] BOUNDARY SCAN TEST METHOD AND APPARATUS

[75] Inventors: Edward Scott, Anaheim Hills; Kaz Takata, Placentia, both of Calif.; Toshiharu Fukui, Atsugi, Japan

[73] Assignees: Sony Corportion, Tokyo, Japan; Sony Trans Com, Inc., Irvine, Calif.

[21] Appl. No.: 689,876

[22] Filed: Aug. 15, 1996

Related U.S. Application Data

[63] Continuation of Ser. No. 315,237, Sep. 29, 1994, abandoned.

[51] Int. Cl.[6] ............................................ G01R 31/28
[52] U.S. Cl. .................................. 395/183.06; 371/22.32
[58] Field of Search ................................ 340/660, 661, 340/662, 663; 327/74, 75, 91, 94, 50, 1; 395/183.15, 183.06; 371/22.3

[56] References Cited

U.S. PATENT DOCUMENTS

| | | | |
|---|---|---|---|
| 5,066,909 | 11/1991 | Firooz | 324/158.1 |
| 5,210,527 | 5/1993 | Smith et al. | 340/659 |
| 5,282,213 | 1/1994 | Leigh et al. | 371/22.1 |
| 5,285,152 | 2/1994 | Hunter | 324/73.1 |

OTHER PUBLICATIONS

"Writing Correct and Usable Specifications for Board Test: A Case Study", Barry A. Alcorn, IEEE International Test Conference, Meeting the Test of Time, Aug. 1989, pp. 773–786.

*Primary Examiner*—Albert DeCady
*Attorney, Agent, or Firm*—Blakely, Sokoloff, Taylor & Zafman LLP

[57] ABSTRACT

A boundary scan analog signal test circuit for boundary scan testing of analog signals. The boundary scan analog signal test circuit provides for known upper and lower bound values at specified times for testing whether sample analog signals are within the specified lower and upper bound values. If the sample analog signals are not between the known upper and lower bound values, the boundary scan analog signal test circuit produces a result flag indicating a "not pass" for the device being tested. If the sample analog signal being tested is found to be within the known upper and lower bound values, then the circuit generates a result flag indicating that the device being tested has passed the test.

11 Claims, 2 Drawing Sheets

5,848,235

BOUNDARY SCAN TEST METHOD AND APPARATUS

This is a Continuation Application of application Ser. No. 08/315,237, filed Sep. 29, 1994, now abandoned.

BACKGROUND OF THE INVENTION

1. Field of Invention

The invention relates to the field of built-in test equipment for electronic devices, printed circuit boards and systems. More particularly, the invention relates to a built-in analog test circuit for testing analog signals within a boundary scan test environment.

2. Art Background

Prior art testing methodologies for testing circuit boards and the like include techniques using bed of nails fixtures and mechanical probes. Such methodologies are rapidly reaching technological limits due to increased complexity of circuitry elements and miniaturization of packaging, as well as inaccessibility of test nodes particularly for integrated circuits (ICs). In addition, bed of nails testing does not adequately test surface mount printed circuit boards.

To overcome obstacles presented by increasing complexity and miniaturization of ICs, a test methodology has been developed where test circuits are built directly onto integrated circuits. Such "built-in self-test" or "scan design" circuits have been extended for use on printed circuit boards as well as within integrated circuits, as a boundary scan test. Examples of boundary scan testing are described in IEEE 1149.1 and JTAG specifications. Additionally, a proposed IEEE P1149.5 specification describes a bused boundary scan testing methodology. Currently, there is no effective methodology for testing analog signals and circuitry and for reporting results using IEEE 1149.1 or IEEE P1149.5 test protocols. Although boundary scan provides a built-in test methodology for digital hardware, there is much equipment, including in-flight entertainment systems and vehicular systems, where analog circuitry is utilized. It would be desirable to develop boundary scan test methodologies for testing analog circuits as well as digital circuits.

SUMMARY OF THE INVENTION

The invention extends boundary scan testing to allow testing of analog signals and circuitry, by providing a boundary scan analog signal tester for testing of analog signals. The boundary scan analog signal tester provides known upper and lower boundaries at specified time offsets for testing whether sample analog signals are within a specified range defined by the boundaries.

In a preferred embodiment, the invention comprises means for accepting sample analog signals to be tested, means for capturing and temporarily holding the sample analog signals, means for comparing the sample analog signals against known upper and lower bound values, and means for producing a test result to indicate whether the sample analog signal under test is within or outside the known upper and lower bound values. In sum, the invention provides a method and apparatus for extending the boundary scan testing technique to analog based devices and systems.

DETAILED DESCRIPTION OF THE INVENTION

Apparatus and method for a boundary scan analog signal tester is disclosed in the following description. For purposes of explanation, specific types of signals, circuit components, etc., are set forth in order to provide a thorough understanding of the present invention. However, it will be apparent to one skilled in the art that the present invention may be practiced without the specific details.

Figure 1:
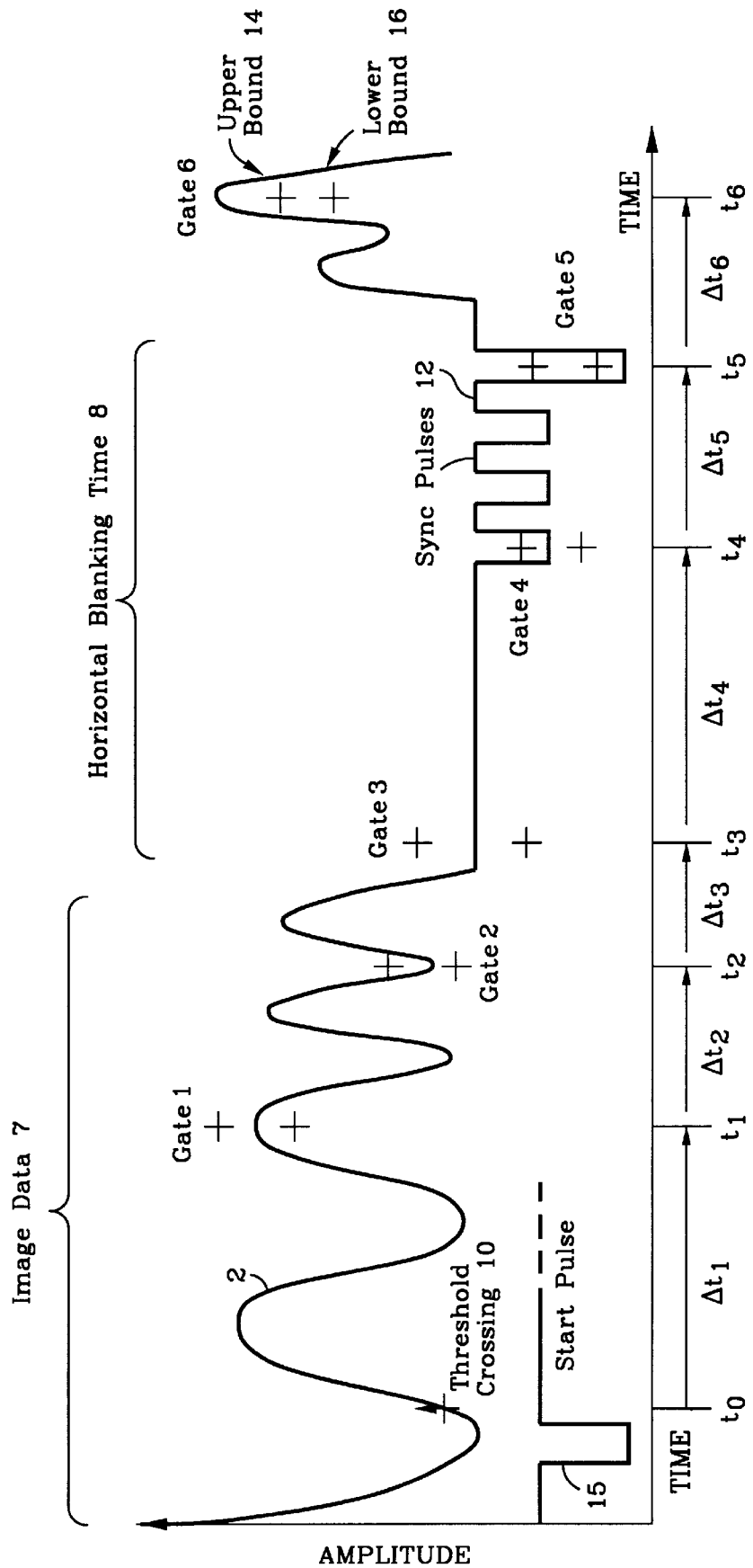
FIG. 1 is a graph illustrating an exemplary analog signal to be tested.

FIG. 1 illustrates an exemplary analog signal (horizontal video scan line) 2 to be tested. In a typical test setup, analog signal 2 is received from the circuitry under test, such as a television set or an aircraft entertainment system or portions thereof. Signal 2 to be tested is applied to a boundary scan analog signal tester, the circuitry of which will be described in more detail in the description of FIG. 2.

Signal 2 is composed of and is illustrated by image data 7, horizontal blanking time 8 and sync pulses 12. Gates 1 through 6 illustrate slalom gates with upper bound 14 and lower bound 16 within which signal 2 must pass.

Start pulse 15 begins a test cycle. When signal 2 crosses the threshold 10 in the correct direction, time $t_0$ is established. After a predetermined time period, delta $t_1$, at the signal is expected to fall within the tolerance of the upper and lower bounds of Gate 1. Since signal 2 does pass between Gate 1's upper and lower bounds 14 and 16, no error occurred at time $t_1$.

Likewise with slalom gates 2, 3 and 4, signal 2 passing between the upper and lower bounds of these slalom gates passes the test. When signal 2 passes above the upper bound or below the lower bound of a slalom gate, a fault has occurred. At time $t_5$ signal 2 passes below the lower bound of Gate 5 and a fault has occurred. Similarly at $t_6$ signal 2 passes above the upper bound of Gate 6 and a fault has occurred. With the invention, test point time Δ as illustrated by Δ $t_1$ through Δ $t_6$ need not be equal. The slalom gate width may also be varied to allow different threshold tolerances. In addition, signal 2 may be tested for passing above some value or passing below some value, but not necessarily between two values.

Figure 2:
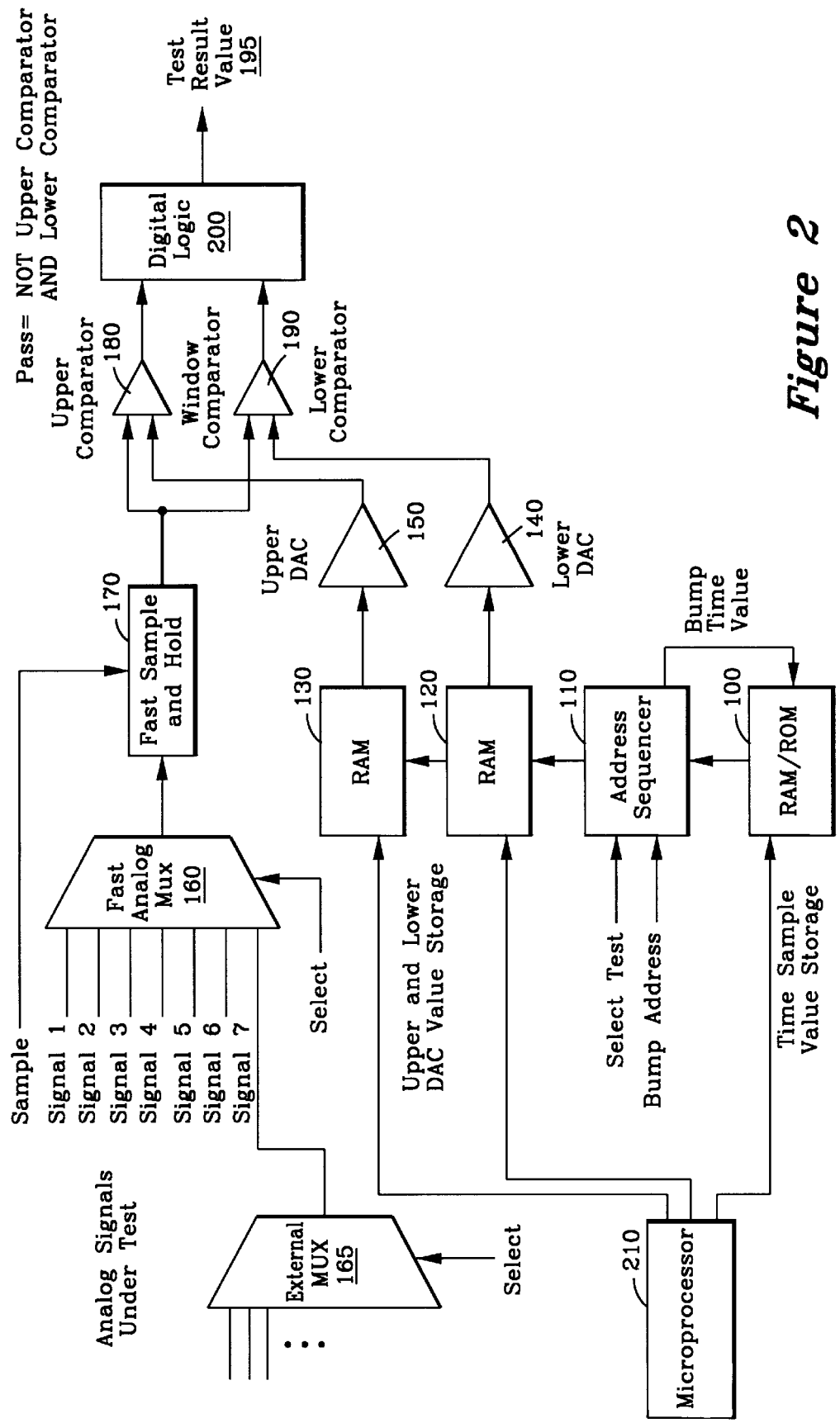
FIG. 2 is a block diagram of a built-in analog tester configured in accordance with one aspect of the invention.

Now referring to FIG. 2, circuitry for the slalom gate boundary scan analog tester is illustrated. The circuitry includes analog multiplexer 160 for selecting analog signals for testing, fast sample and hold device 170 for capturing and holding the value of signal 2 at a specified instant in time and a pair of window comparators 180 and 190 for comparing the sample signals against known upper and lower bound values. The slalom gate boundary scan analog testing circuitry also includes digital logic circuitry 200 which receives outputs from window comparators 180 and 190 and converts their output into a 2 bit digital value 195 indicating whether the value was between the specified upper and lower bound values.

As illustrated in FIG. 2, fast analog multiplexer 160 accepts the analog signals to be tested. Although multiplexer (MUX) 160 is illustrated with seven input signals, the MUX may be designed to accommodate any number of input signals. One or more additional analog MUXes 165 may be cascaded to increase the number of signals which can be tested. Such testing is done in real time while the circuit is operational or in a background mode where the circuit is exercised beyond its normal limits.

As illustrated in FIG. 2, a storage device 100 in the form of read-only-memory (ROM) or random-access-memory (RAM) is used to store time sample values (shown as $T_0$–$T_6$ of FIG. 1) Storage device 100 outputs the time sample values into an address sequencer 110. Address sequencer 110 which also receives select test signal 105 and bump address signal 115 is coupled to upper and lower bound value storage devices 120 and 130. Upper and lower bound value storage devices 120 and 130 output known upper and lower bound values in digital form to upper and lower digital-to-analog converters 150 and 140, respectively, which convert the digital upper and lower bound values into upper and lower bound, analog values for comparing against the test signal value.

As an alternative to using the digital-to-analog converters, an analog-to-digital converter may be placed after fast sample and hold device 170 to compare the values in digital form. However, the primary problem with using an analog-to-digital converter is that analog-to-digital converters are slower and would not allow testing at higher frequencies. Typically, analog-to-digital converters are also more expensive.

Microprocessor 210 (or a microcontroller) may be used to manage the process by reloading upper and lower bound value storage devices 120 as well as time sample value storage device 100.

The analog signals generated by upper and lower digital-to-analog converters 150 and 140, are provided to upper comparator 180 and lower comparator 190, respectively. Upper and lower comparators 180 and 190 output a digital signal to indicate either that the signal fell within the window or did not fall within the window.

Comparators 180 and 190, and digital logic 200 may be replaced by a more complex window comparator that indicates whether a signal being tested is above the window, below the window or in the middle of the window.

Outputs from the comparators are provided to digital logic device 200 which analyzes the outputs and generates a test result value 195 indicating a pass or a fail determined by whether or not a signal under test was within the specified boundaries.

Analog signals under test will have widely varying requirements for number of test gates. Signals such as video signals may only require a small number of test points per scan line. Other signals with numerous critical timing requirements may require a much larger number of test gates to assure correct operation.

The boundary scan analog signal tester of the present invention is valuable in performing testing of video signals in an entertainment system. The same technique may also be applied to DC signals, such as power supply signals. Such DC signals may be tested to determine whether or not the signals are within a certain tolerance range. The testing may be performed during normal operation of the device being tested or as an off line or background task.

In addition, the boundary scan analog signal tester is applicable to satellites. Satellites utilize a large amount of analog circuitry, and, as such, the slalom gate boundary scan analog signal testing may be applicable to satellite and satellite-type signals. It may be very useful to have testing capability of the invention built directly into a satellite-related circuitry. The boundary scan analog signal tester may also be used to test airline passenger entertainment equipment, as well as to be used as a field service test method for in-flight or in the factory testing. Furthermore, the boundary scan analog signal tester may be used for analog signal testing in automobiles and other vehicles and for testing analog signals in many other fields.

What was described was a boundary scan analog signal tester for testing analog based devices and systems. It will be appreciated that the above-described invention may be embodied in other specific forms without departing from the spirit or essential characteristics thereof. The present embodiments are, therefore, to be considered in all aspects as illustrative and not restrictive on the broad invention, in that this invention not be limited to the specific arrangements and constructions shown and described, since there are other modifications which may occur to those skilled in the art.

What is claimed is:

1. An apparatus for boundary scan testing of analog signals from a board, comprising:

a plurality of means for receiving a sample analog signal having time varying amplitude or constant amplitude;

means for capturing said sample analog signals at predetermined instances in time for testing time slices of said sample analog signal, said means for capturing coupled to said plurality of means for receiving;

first means for storing and providing predetermined time sample values, said time sample values defining said predetermined instances in time at which said sample analog signals are tested;

second means for storing said known upper and lower bound values in digital form, said known upper and lower bound values used as boundaries within which said sample analog signal must reside, said upper and lower bound values configured to vary with each said time slice;

means for converting said known upper and lower bound values from digital to analog values for comparing said sample analog signal with said known upper and lower bound values in analog form, said means for converting coupled to said second means for storing;

means for comparing said known upper and lower bound values with said sample analog signal to determine whether said sample analog signal is within said known upper and lower bound values, said means for comparing coupled to said means for converting;

means for determining whether said amplitude of said sample analog signal is between known upper and lower bound values at said predetermined instances in time, said means for determining coupled to said means for comparing.

2. The apparatus of claim 1, further comprising means for receiving a sample analog signal having constant amplitude.

3. The apparatus of claim 1, further comprising means for generating a pass result, if said sample analog signal is between said known upper and lower bound values, and for generating a fail result otherwise.

4. The apparatus of claim 1, further comprising means for generating a pass result, if said sample analog signal is above said known upper and lower bound values, and for generating a fail result otherwise.

5. The apparatus of claim 1, further comprising means for generating a pass result, if said sample analog signal is below said known upper and lower bound values, and for generating a fail result otherwise.

6. The apparatus of claim 1, further comprising means for loading said upper and lower bound values to said means for storing.

7. A boundary scan analog signal test device comprising:

a plurality of analog multiplexers for accepting sample analog signals to be tested;

a fast sample and hold device for accepting said sample analog signals to be tested from said analog multiplexer at predetermined instances of time, said fast sample and hold device coupled to said plurality of analog multiplexers;

a first storage element for storing sample time values, said sample time values defining predetermined instances of time slices at which the sample analog signals are tested;

a second storage element for storing known upper bound values in digital form, said known upper bound value used as an upper boundary beyond which said sample analog signal must not reside;

a third storage element for storing known lower bound values in digital form, said known upper bound value used as an upper boundary beyond which said sample analog signal must not reside, said upper and lower bound values configured to vary with each said time slice;

an upper digital-to-analog converter for accepting said known upper bound values from said second storage element and converting said known upper bound values from digital form into analog form, said upper digital-to-analog converter coupled to said second storage element;

a lower digital-to-analog converter for accepting said known lower bound values from said third storage element, and converting said known lower bound values from digital form to analog form, said lower digital-to-analog converter coupled to said third storage element;

an upper window comparator for accepting said sample analog signals to be tested from said fast sample and hold device, and accepting said known upper bound values from said upper digital-to-analog converter, and comparing said sample analog signals against said known upper bound values, said upper window comparator coupled to said upper digital-to-analog converter and said fast sample and hold device;

a lower window comparator for accepting said sample analog signals from said fast sample and hold device, and accepting said known lower bound values from said lower digital-to-analog converter and comparing said sample analog signals against said known lower bound value, said lower window comparator coupled to said lower digital-to-analog converter and said fast sample and hold device; and a digital logic device for accepting outputs from said upper and said lower window comparators, and generating a result flag of pass, if said sample analog signals are between said known upper bound value and said known lower bound value, and for generating a result flag of fail otherwise, said digital logic device coupled to said upper and said lower window comparators.

8. The apparatus of claim 7, wherein said first storage element comprises a ROM.

9. The apparatus of claim 7, wherein said first storage element comprises a RAM.

10. A method for boundary scan testing of analog signals from a board comprising the steps of:

accepting sample analog signals to be tested;

capturing said sample analog signals at predetermined instances in time for testing time slices of said sample analog signals;

storing and providing predetermined time sample values, said time sample values defining said predetermined instances in time at which said sample analog signals are tested;

comparing said sample analog signals against known upper and lower bound values to examine whether said sample analog signals are within or outside of said known upper and lower bound values, said upper and lower bound values configured to vary with each said time slice; and generating a result for said time slice of pass if said sample analog signals are within said known upper and lower bound values and generating a result for said time slice of fail if said sample analog signals are outside of said known upper and lower bound values, said method capable of performing said boundary testing during normal operations and in a background mode.

11. The method of claim 10 further comprising the steps of:

storing known upper and lower bound values in digital form; and converting said known upper and lower bound values from digital form into analog form.

* * * * *